(12) United States Patent
Viebach

(10) Patent No.: US 6,441,460 B1
(45) Date of Patent: Aug. 27, 2002

(54) LARGELY VOLTAGE-INDEPENDENT ELECTRICAL RESISTOR FORMED IN AN INTEGRATED SEMICONDUCTOR CIRCUIT

(75) Inventor: Michael Viebach, Kolbermoor (DE)

(73) Assignee: STMicroelectronics GmbH, Grasbrunn (DE)

( * ) Notice: Subject to any disclaimer, the term of this patent is extended or adjusted under 35 U.S.C. 154(b) by 0 days.

(21) Appl. No.: 09/548,793

(22) Filed: Apr. 13, 2000

(30) Foreign Application Priority Data

Apr. 16, 1999 (DE) .......................... 199 17 370

(51) Int. Cl.[7] ............................................. H01L 29/00
(52) U.S. Cl. ................. 257/536; 257/356; 257/359; 257/360; 257/362; 257/541
(58) Field of Search ................. 257/536, 541, 257/362, 360, 356, 359

(56) References Cited

U.S. PATENT DOCUMENTS 4,466,013 A  *  8/1984  van de Plassche et al. ... 357/51
5,469,095 A  * 11/1995  Peppiette et al. ........... 327/110

FOREIGN PATENT DOCUMENTS

| DE | 3526461 A1 | 1/1987 |
|---|---|---|
| EP | 0001574 A1 | 2/1979 |
| EP | 0017919 A1 | 10/1980 |
| JP | 57141951 A | * 9/1982 |

* cited by examiner

Primary Examiner—Nathan Flynn
Assistant Examiner—Remmon R. Fordé
(74) Attorney, Agent, or Firm—Lisa K. Jorgenson; E. Russell Tarleton; SEED IP Law Group PLLC

(57) ABSTRACT

An electrical resistor integrated in an integrated semiconductor circuit to have a useful resistor with two spaced-apart useful resistor terminal contact regions and a useful resistor region of semiconductor material located therebetween; and an auxiliary resistor having two spaced-apart auxiliary resistor terminal contact regions and an auxiliary resistor region located therebetween. The auxiliary resistor region is formed in semiconductor material located underneath the useful resistor region; an intermediate region is provided between the useful resistor region and the auxiliary resistor region; the useful resistor region and the auxiliary resistor region have a substantially identical topography; and the auxiliary resistor terminal contact regions and the useful resistor terminal contact regions are wired in such a manner that, on connection of the semiconductor circuit to a supply voltage source, the auxiliary resistor terminal contact region at one end of said auxiliary resistor region and the auxiliary resistor terminal contact region at the other end of said auxiliary contact region each have the same potential difference with respect to the respectively adjacent useful resistor terminal contact region.

34 Claims, 9 Drawing Sheets

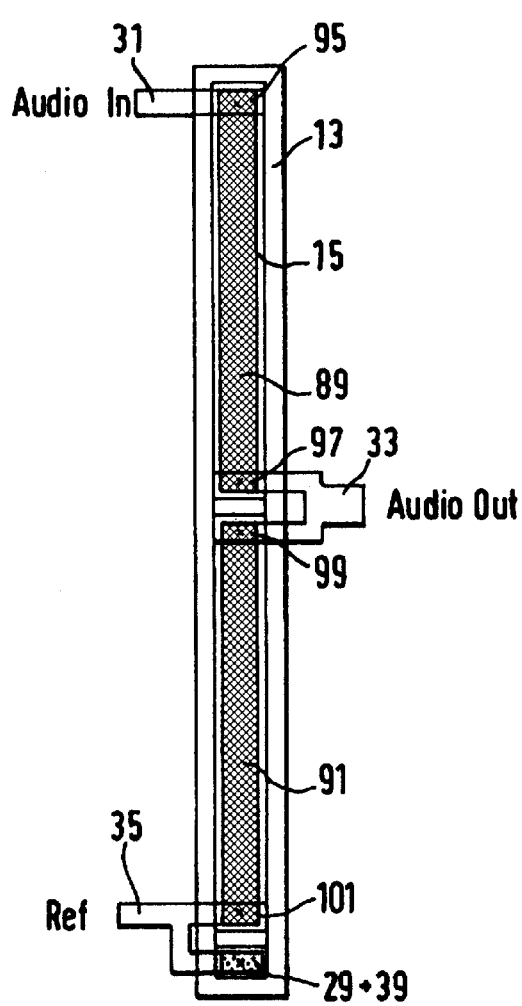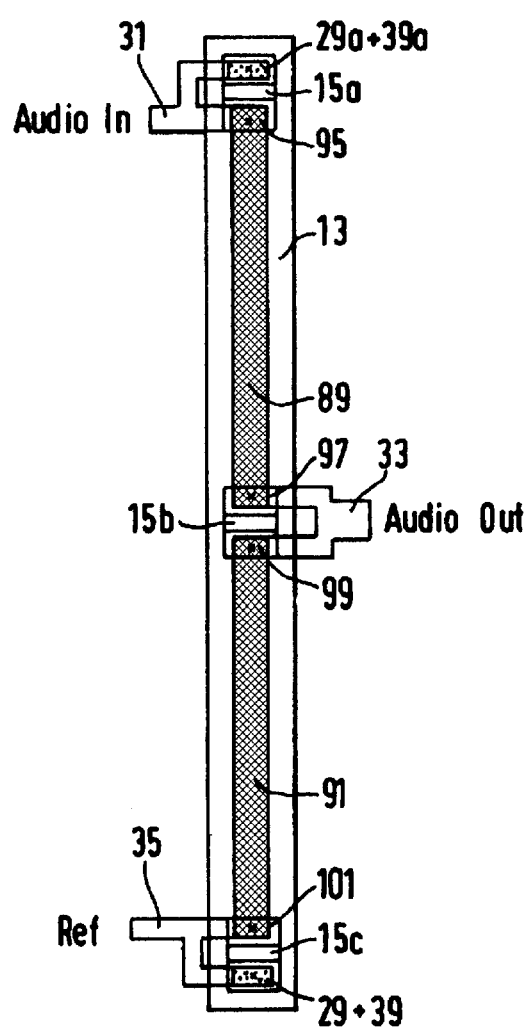

LARGELY VOLTAGE-INDEPENDENT ELECTRICAL RESISTOR FORMED IN AN INTEGRATED SEMICONDUCTOR CIRCUIT

TECHNICAL FIELD

The invention relates to an electrical resistor formed in an integrated semiconductor circuit.

BACKGROUND OF THE INVENTION

Electrical resistors find application, in particular in a resistor chain as used, for example, for attenuation or amplification of audio signals.

Integrated resistors are formed by resistance regions of semiconductor material which extend between spaced apart terminal contacts. A resistance region may be a diffusion region of a first conductivity type diffused into the surface of a diffused or implanted pocket of the opposite conductivity type. An example hereof is shown in DE 35 26 641 A1. The resistance region may also be a diffusion region of a first conductivity type diffused into the surface of an epitaxial pocket of the opposite conductivity type. Examples thereof are shown in EP 0 001 574 A1 and EP 0 017 919 A1. Moreover, the resistance region can be formed by an epitaxial pocket of a first conductivity type that is formed on a substrate of the opposite conductivity type. In all cases there is a pn junction between the resistance region and the semiconductor material located therebeneath. The semiconductor material located underneath the resistance region has such a potential applied thereto that it is ensured between resistance region and semiconductor material therebeneath, in case of all voltages applied to the terminal contacts of the resistance region, that the pn junction between resistance region and semiconductor material therebeneath is biased in blocking direction, thereby forming, for isolation, a charge-carrier depleted space-charge region between resistance region and semiconductor material located therebeneath. With changing difference between the potential arising in the resistance region and the potential arising in the semiconductor material located therebeneath, the breadth (extension) of the space-charge region changes, which has an effect on the resistance value of the integrated resistor and on the voltage drop along the resistance region of the integrated resistor.

EP 001 574 is not concerned with this problem. This document discloses a semiconductor structure which is flexible with respect to its final usability and in which an N⁻ epitaxial layer located on a substrate first has a P⁺ region formed therein, with an N⁻ region being formed in the surface of the latter. In accordance with the type of contacting, the three-layer structure obtained in the epitaxial layer can be utilized for realizing a transistor or for realizing two resistors on top of each other which are separated from each other by the central layer. Resistance changes arising with changing potential due to the correspondingly changing space-charge region are not avoided in this known structure.

DE 35 26 461 A1 is not concerned with the problem mentioned either. In case of this document, the dependency of the linearity of the divisor ratio of an integrated resistor chain on the contact resistances of the contacting regions of the individual resistors of the resistor chain is counteracted by forming the individual resistors not in one single common resistance path, but by forming each individual resistor in a separate resistance path with two terminal contact regions.

In case of the semiconductor structure known from EP 0 017 919 A1, the dependency of an integrated resistor on changes in the space-charge region isolating the resistor and dependent on potential changes, is reduced by forming the resistor by two series-connected resistance regions each having associated therewith a respective insulating region of its own of an epitaxial layer located underneath the resistance regions, which both have different potentials applied thereto. In said document, such potential application to the individual resistance regions and the individual insulating regions is carried out that, in case of a change in voltage applied to the two resistance regions, a resistance reduction of the one resistance region and a resistance increase in the other resistance region compensate each other.

When the integrated resistor is utilized for attenuation of an alternating voltage signal, for example an audio signal, the potential difference between the resistance region and the semiconductor material therebeneath changes in accordance with the alternating potential applied to the resistance region. This effects a corresponding modulation of the space-charge region formed at the pn junction. This in turn effects modulation of the resistance value of the integrated resistor and of the voltage drop along the resistance region. When the integrated resistor is used for attenuation of an audio signal, this causes distortion with a specific distortion factor.

Reduction of this distortion factor was obtained by integrated resistors, the resistance region of which is formed by a layer of polycrystalline silicon located on an insulating layer, preferably an oxide layer, which mostly is formed on the surface of an epitaxial pocket or directly on the substrate. With variable potential difference between this resistance region and the semiconductor material located therebeneath, impairment of the integrated resistor occurs in case of such an integrated resistor as well, which in particular consists in resistance modulation in case of alternating voltages and in distortion in case of audio signals. This is due to the fact that, as a result of effects in accordance with the field strength on the bottom side of the polycrystalline resistance region directed towards the oxide layer, charge carrier concentrations result that change with the potential difference between the resistance layer and the semiconductor material located beneath the oxide. This mechanism is comparable to the effects of the gate potential of a MOS transistor on the channel region located underneath the gate oxide.

In a practical version of a conventional integrated audio circuit in which such resistors of polycrystalline silicon are used with a voltage dependency of approx. 100 ppm, audio voltage dividers with 6 db attenuation at 1 Vrms at the input of the divider obtained a distortion factor of 0.004 percent at the output of the divider. Still better results are obtained when resistors are used whose resistance region consists of an oxide-insulated silicon-chromium layer. However, the manufacture of such silicon-chromium resistors is very complex and expensive.

Although integrated resistors with resistance regions in the form of polycrystalline silicon layers or silicon-chromium layers result in lower distortion factors than integrated resistors in the form of diffused resistance regions or in the form of epitaxial resistance regions, there are applications for which a reduction in distortion factor is desired to a value that is still markedly lower than that distortion factor that can be obtained using polycrystalline and silicon-chromium resistance regions, respectively.

SUMMARY OF THE INVENTION

According to disclosed embodiments of the invention, the foregoing can be achieved by forming in the semiconductor material underneath the useful resistor region an additional auxiliary resistor region such that an equivalent voltage drop curve arises along the useful resistor region and along the auxiliary resistor region.

An integrated resistor according to disclosed embodiments of the invention comprises a useful resistor having two spaced-apart useful resistor terminal contact regions for connection of useful resistor contacts and a useful resistor region of semiconductor material located therebetween. An auxiliary resistor having two spaced-apart auxiliary resistor terminal contact regions for connection of auxiliary resistor terminal contacts and an auxiliary resistor region located therebetween is provided in the semiconductor material underneath the useful resistor region. The useful resistor region and the auxiliary resistor region are separated from each other by an electrically insulating intermediate region. The useful resistor region and the auxiliary resistor region have substantially identical topographies. The auxiliary resistor terminal contact regions are each connected to the same electrical potential as the respectively adjacent useful resistor terminal contact regions, or the potential thereof is each shifted by the same d.c. voltage potential difference for improved isolation.

Without application of a potential shift and with exactly identical topography of useful resistor region and auxiliary resistor region, there is created, at all locations along the useful resistor region, a potential difference of zero between useful resistor region and auxiliary resistor region. Upon application of an a.c. voltage both to the useful resistor and to the auxiliary resistor, there are indeed arising changes in time of the potential values in the useful resistor region and the auxiliary resistor region corresponding to the a.c. voltage curve. The potential difference between useful resistor region and auxiliary resistor region, however, remains about the same at all times and at all locations along the useful resistor region. Resistance changes and resistance modulations thus hardly occur in the useful resistor. Resistance changes in the auxiliary resistor, however, do occur because of the changing potential difference between auxiliary resistor and substrate located therebeneath. The change in resistance due to voltage dependency is thus quasi shifted from the useful resistor to the auxiliary resistor where it has no disadvantageous effects.

In case of integrated resistors in which the useful resistor region is separated from the auxiliary resistor region by a pn junction, it is sufficient for electrical isolation between useful resistor region and auxiliary resistor region if a blocking biasing voltage is present across the pn junction, i.e., a biasing voltage lower than the threshold voltage at which the pn junction reaches the conducting state. The potential difference across the pn junction thus may be zero, which is the case if the topographies of useful resistor region and auxiliary resistor region are exactly identical and if the auxiliary resistor terminal contacts and the respectively adjacent useful resistor terminal contacts have the same potential applied thereto. However, it must be avoided in all cases that a voltage difference occurs at the pn junction that brings the pn junction to the conducting state. It is true that the potential difference of zero is sufficient for isolation, but care is to be taken that the highest voltage dependency in case of diffused resistors is present especially in the range of low blocking voltages and that minor errors in the voltage drop curve of the auxiliary resistor may still have a noticeable effect.

With practical applications, it will be difficult to obtain the ideal case that the useful resistor region and the auxiliary resistor region have exactly identical topographies. This leads to certain deviations in the voltage drop curves of the useful resistor region on the one hand and the auxiliary resistor region on the other hand. In particular when larger deviations between the topographies of useful resistor region and auxiliary resistor region should be or must be tolerated for manufacturing reasons, along with the concomitant deviations of the voltage drop curves of useful resistor region and auxiliary resistor region, it is possible to provide between the useful resistor terminal contact regions and the respectively adjacent auxiliary resistor terminal contact regions one d.c. voltage source with identical voltage each, instead of connecting the auxiliary resistor terminal contact regions to the same potential as the useful resistor terminal contact regions. By means of this d.c. voltage source, the pn junction between useful resistor region and auxiliary resistor region is biased such that it is ensured also in case of deviations of the voltage drop curves of useful resistor region and auxiliary resistor region that the pn junction located therebetween definitely does not reach the conducting state and the blocking voltage in total becomes higher and thus is within the range of low voltage dependency.

In audio circuits, the application of the measures according to the invention permits, with the manufacturing technology remaining the same, a considerable reduction in distortion factor to be achieved, or it is possible to change to a simpler manufacturing technology which, without the measure according to the invention, would result in a deteriorated distortion factor. For example, if a conventional integrated resistor were used as basis, having its resistance region formed by a polycrystalline silicon layer, it is possible either to obtain a reduction in the distortion factor, if this is demanded, by addition of an auxiliary resistor to this polycrystalline resistor, or it is possible, if the distortion factor obtained with the conventional polycrystalline resistor is sufficient, to change, for example, to a diffused resistor and associate an auxiliary resistor with the same. If the distortion factor need not be improved, such change of technology is advantageous since it is possible to use for diffused resistors manufacturing technologies requiring no additional masks, as they are necessary for producing polycrystalline resistors. When no improved distortion factor with respect to the conventional polycrystalline resistor is required, lower manufacturing costs may be achieved by changing over to a diffused useful resistor along with an additional auxiliary resistor.

Associating an integrated auxiliary resistor with an integrated useful resistor is advantageous in case of single resistors, but in particular in case of resistor chains (for resistance dividers/voltage dividers). The disclosed embodiment of the invention is especially advantageous for resistors having a.c. voltage signals, for example audio signals, applied thereto since the resistance modulation is fully or to the largest possible extent eliminated by the a.c. voltage signal. However, the invention is also advantageous for resistors having d.c. voltages only applied thereto, in particular in circuits requiring high-precision resistance conditions. With conventional precision resistance dividers, it was either necessary to ensure a high-precision resistor topography and to consider the resistance values changed by the voltage dependency, or to trim the resistors emanating from the manufacturing process by means of laser beams. Both methods result in correspondingly high manufacturing costs.

Due to the fact that an integrated resistor made in accordance with the invention results in exact, voltage-independent resistance conditions also with simple manufacturing methods, such cost-increasing measures can be avoided.

BRIEF DESCRIPTION OF THE DRAWINGS

FIG. 6a shows voltage drop curves upon application of the measures according to FIG. 1a;

FIG. 14 shows an example of a topography of the resistor chain of conventional type as shown in FIG. 10;

FIG. 15 shows an example of a topography of the resistor chain of the type according to the invention, as shown in FIG. 12;

DETAILED DESCRIPTION OF THE INVENTION

Figure 1A:
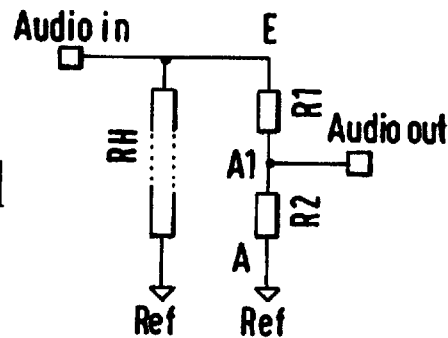
FIG. 1a shows a circuit diagram of an example of a resistor chain of only two useful resistors, along with the auxiliary resistor arranged spatially therebeneath, which in the case shown is connected directly parallel to the useful resistor chain.
Figure 1:
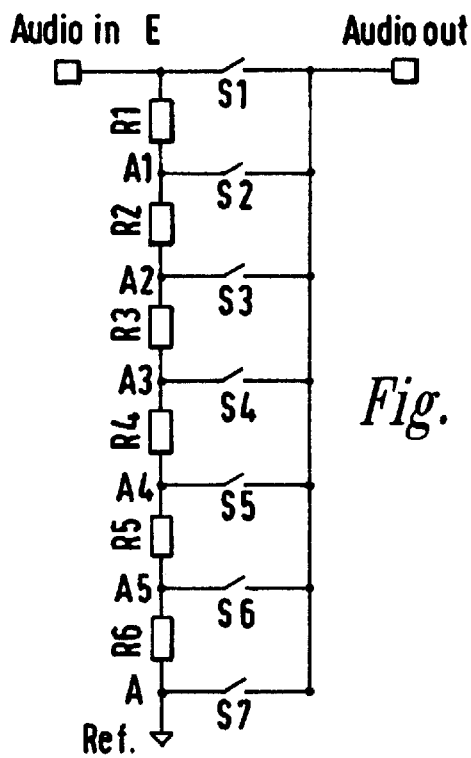
FIG. 1 shows a circuit diagram of an example of a switchable resistor chain that may be composed with resistors according to the invention.

FIG. 1 shows a circuit diagram of an exemplary resistor chain comprising six series-connected resistors R1 to R6 between which five taps A1 to A5 are formed. Resistor chain R1 to R6 has two end terminal contacts, namely an input terminal contact E and a base terminal contact A. The two end terminal contacts E and A are connected to an audio signal input "Audio in" and to a reference voltage input Ref, respectively. Input terminal contact E, taps A1 to A5 and base terminal contact A are each connected via one of seven controllable switches S1 to S7 to an audio signal output "Audio out". Depending on the required attenuation for the audio signal, one of the switches S1 to S7 is controlled to the conducting state.

Such resistor chains are used in audio signal processing circuits, for example in the input circuit or in the feedback circuit of an operational amplifier, in order to be able to attenuate or amplify the audio signal with the desired intensity.

FIG. 1a shows a circuit diagram of an exemplary useful resistor chain of two useful resistors R1 and R2. The end terminal contacts E and A of useful resistor chain E are connected to the audio signal input "Audio in" and reference voltage "Ref", respectively. Auxiliary resistor RH located spatially below the useful resistor chain is connected to terminals "Audio in" and "Ref" directly parallel to the useful resistor chain. The partial voltage tap A1 of useful resistor chain R1, R2 is connected to audio signal output Audio out and has no connection to auxiliary resistor RH. The high-impedance regions of auxiliary resistor RH, which in terms of topology are located directly below useful resistors R1 and R2 and in which the auxiliary voltage drop takes place, are depicted in solid liens. The low-impedance regions of auxiliary resistor RH, at which no voltage drop takes place since the associated part of the auxiliary resistor region is located in the area of a lower-impedance buried layer, are depicted in broken lines.

Figure 1B:
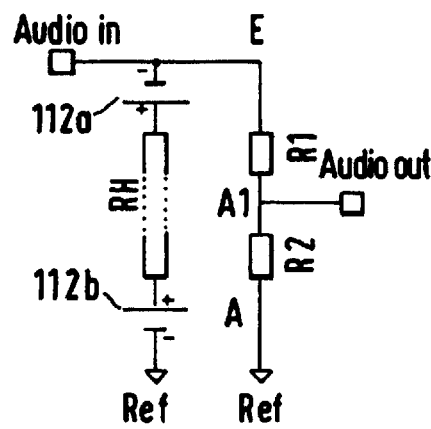
FIG. 1b shows a circuit diagram of an example of a resistor chain of two useful resistors in which the auxiliary resistor is connected in parallel to the useful resistor chain so as to increase the blocking voltage across d.c. voltage sources.

FIG. 1b shows a circuit diagram according to FIG. 1a, in which however auxiliary resistor RH is connected, via d.c. voltage sources 112a, 112b, parallel to useful resistor chain R1, R2 in order to increase the blocking voltage. The two sources 112a, 112b have the same voltage values. At each end of auxiliary resistor RH, there is provided one of the two d.c. voltage sources 112a, 112b. It is thus ensured that the insulating space-charge region between useful resistors R1 and R2 and the auxiliary resistor RH located therebelow is maintained also in case of an inaccurate topology or other influences. In addition thereto, the resistance-modulating effect of the differential voltage R1 and R2 between auxiliary resistor and useful resistor on the useful resistors R1 and R2 becomes lower.

Figure 1C:
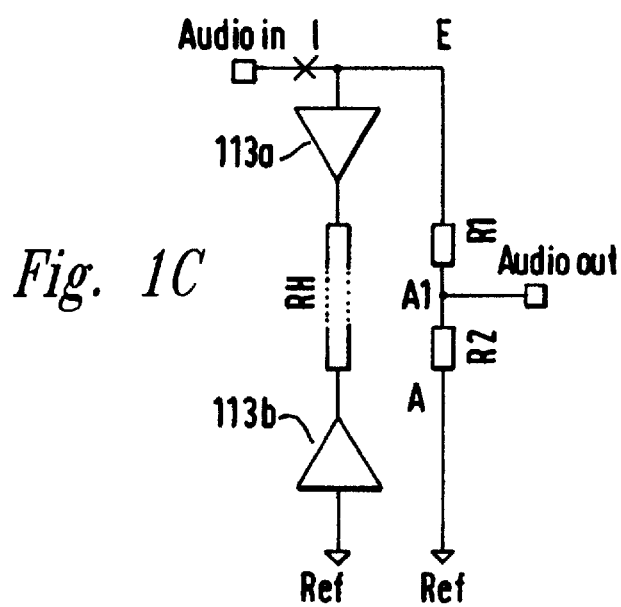
FIG. 1c shows a circuit diagram of an example of a resistor chain of two useful resistors, in which the auxiliary resistor is connected in parallel via voltage followers for decoupling.

FIG. 1c shows a circuit diagram according to FIG. 1a in which, for decoupling, auxiliary resistor RH is connected via voltage followers 113a, 113b, with one each of said voltage followers 113a, 113b being provided at each end of auxiliary resistor RH. In this case, the current I in input "Audio in" and the current in base "Ref" remain unaffected by the current through auxiliary resistor RH, which is affected by the input-voltage dependent resistance modulation. These measures according to FIGS. 1b and 1c may also be employed jointly.

The following figures depict schematic, fragmentary, sectional views, not to scale, of such parts of integrated semiconductor circuits in which integrated electrical resistors are formed. For the sake of simplicity, resistor chains with two resistors only are depicted, although practical embodiments of resistor chains as a rule comprise a larger number of resistors. The combinations of conductivity types of the individual semiconductor regions as shown in these sectional views are of exemplary nature only. The respectively opposite combination of conductivity types may be chosen as well.

Figure 2:
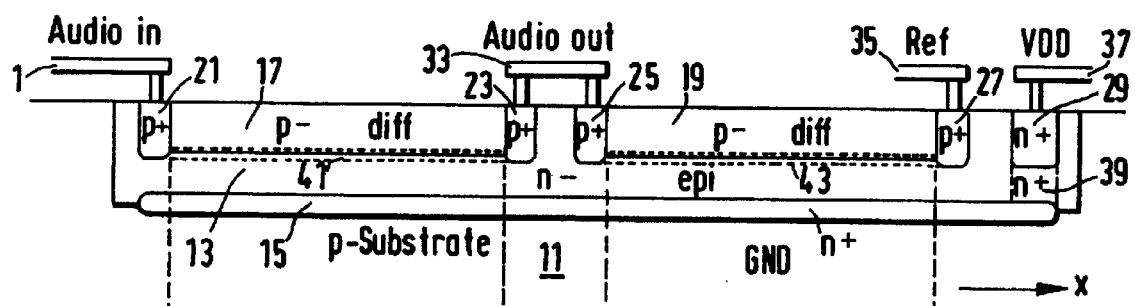
FIG. 2 shows a resistor chain with two diffused resistors of conventional type.

FIG. 2 shows a sectional view of a resistor chain with two diffused resistors of conventional type. A substrate 11 of p⁻ conductivity has formed therein an epitaxial pocket 13 of n⁻ conductivity. In the bottom portion of the latter, there is formed a buried layer 15 of n⁺ conductivity. Diffused into the surface of epitaxial pocket 13 are a first resistor region 17 and a second resistor region 19 of p⁻ conductivity each. First resistor region 17 is provided between two terminal contact regions 21 and 23, whereas second resistor region 19 is provided between two terminal contact regions 25 and 27. Each of the terminal contact regions is of p⁺ conductivity. In a portion outside of the two resistor regions 17 and 19, epitaxial pocket 13 is provided with a terminal contact region 29 of n⁺ conductivity. Terminal contact regions 21 to 29 serve to establish contact of the two resistance regions 17 and 19 and epitaxial pocket 13, respectively, with a metallic conductive track above the surface of substrate 11. Terminal contact region 21 is connected to a metallic conductive track 31 that is connected to audio signal input Audio in. Terminal contact regions 23 and 25 are commonly connected to a metallic conductive track 33 that is connected to audio signal output Output out. Terminal contact region 27 is connected to a metallic conductive track 35 that is connected to reference voltage source Ref. Terminal contact region 29 is connected to a metallic conductive track 37 that serves to supply a positive supply voltage VDD. Substrate 11 has ground potential GND applied thereto.

Between terminal contact region 29 and buried layer 15, there is provided a so-called sinker 39, i.e., a vertical connecting region of high conductivity via which the buried layer 15 and thus the entire epitaxial pocket 13 are brought to the potential of supply voltage source VDD.

At the pn junction between epitaxial pocket 13 and the respective resistor region 17 and 19, respectively, there is formed a space-charge region 41 and 43, respectively, the breadth of which is dependent upon the potential difference between epitaxial pocket 13 and the respective resistor region 17 and 19, respectively.

Figure 3:
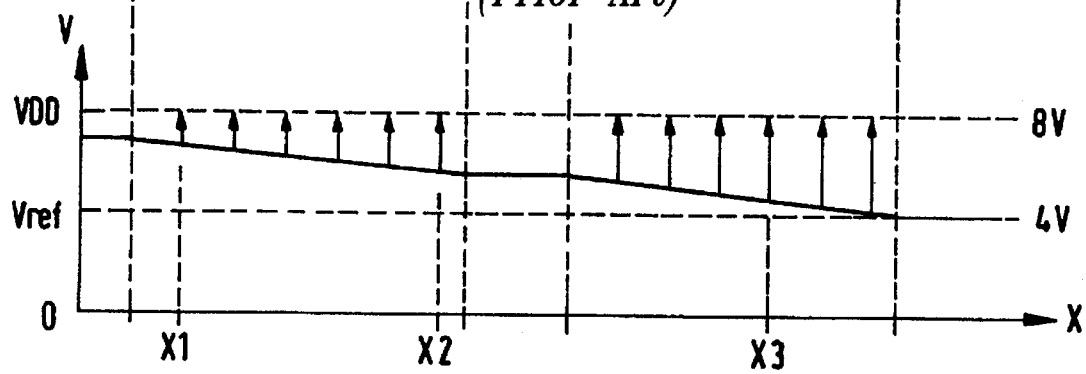
FIG. 3 shows a voltage drop curve along the two diffused resistors of FIG. 2.

FIG. 3 shows a voltage drop curve along both resistor regions 17 and 19 of the resistor chain shown in FIG. 2. Assumed as examples are a supply voltage VDD of 8 V, a mass voltage of 0 V, an intermediate reference voltage Vref of 4 V and an instantaneous voltage of 7 V at audio signal input Audio in. Depicted above the voltage drop curve are arrows the respective length of which represents a measure of the potential difference effective at the pn junction at the particular location along the respective resistor region 17 and 19, respectively. Due to the fact that the breadth of the space-charge region of a pn junction and the charge-carrier filling or charge-carrier depletion, respectively, of the space-charge region is dependent upon the value of the potential difference arising across the pn junction, the individual locations along resistor regions 17 and 19 are of different space-charge breadth and thus of different effective breadth of the resistor path.

Figure 4:
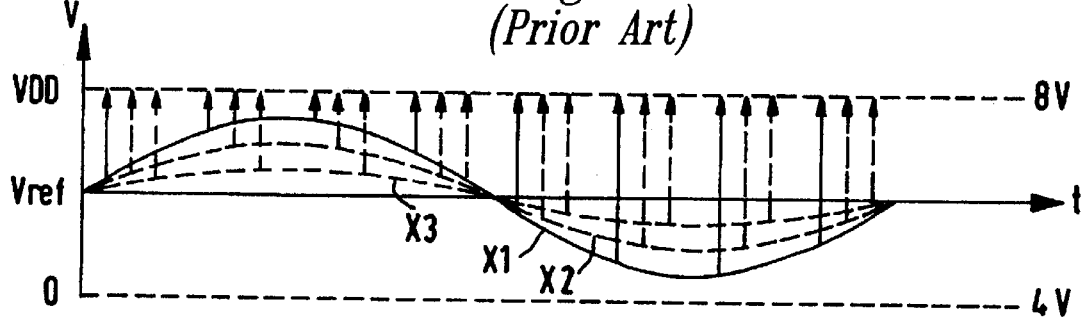
FIG. 4 shows an example of a.c. voltage curves as arising at different locations along the two diffused resistors of FIG. 2.

This is of particularly disadvantageous effect if the resistors of the resistor chain have an alternating voltage applied thereto, such as an audio signal. This will be elucidated by way of FIG. 4. It is assumed in this respect that audio signal input Audio in is fed with a sinusoidal voltage of which FIG. 4 depicts a period in time. Due to the voltage drop along the two resistor regions 17 and 19, this audio signal becomes increasingly weaker with increasing distance from audio signal input Audio in. FIG. 4 depicts the sinusoidal curves at three locations x1, x2 and x3 along the two resistor regions 17 and 19. The sinusoidal curves occurring at locations x1, x2 and x3 are shown in the form of a solid line, broken line and dotted line, respectively. Above the sinusoidal curves there are shown arrows showing the change of the potential difference across the pn junctions of the two resistor regions 17 and 19 at the three locations x1 to x3 versus time. These arrows illustrate how the space-charge regions and thus the resistances and voltage drop curves of the two diffused resistors are modulated as a function of the audio signal. This modulation has the effect that the audio signal tapped at audio signal output Audio Out is inflicted with distortion.

Figure 5:
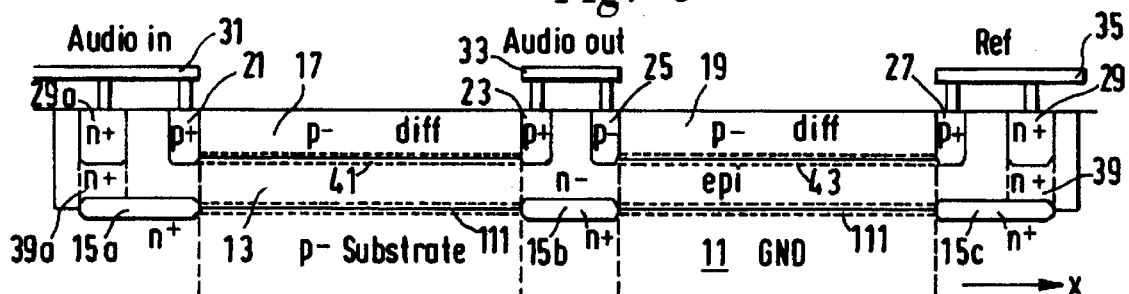
FIG. 5 shows a resistor chain according to the invention comprising two diffused useful resistors and an epitaxial auxiliary resistor.

FIG. 5 shows a sectional view of a resistor chain according to an embodiment of the invention, comprising two diffused useful resistors and an epitaxial auxiliary resistor. The semiconductor structure shown in FIG. 5 to a large part is identical with the semiconductor structure shown in FIG. 2, with the same designations and reference characters as in FIG. 2 being used for corresponding structural elements in FIG. 5. The essential difference of the structure according to the invention as shown in FIG. 5 and the conventional structure as shown in FIG. 2 consists in the following deviations:

Epitaxial pocket 13 comprises, in addition to terminal contact region 29 on its right-hand side in FIG. 5, a second terminal contact region 29a on its left-hand side in FIG. 5. The two terminal contact regions 29a and 29 are connected, together with the respectively adjacent terminal contact region 21 and 27, respectively, of the first resistor region 17 and the second resistor region 19, respectively, to the metallic conductive tracks 31 and 35, respectively, and thus are commonly connected to audio signal input Audio in and reference voltage Vref, respectively. There is provided no buried layer 15 extending across the entire epitaxial pocket 13. There are just individual parts of buried layers 15a, 15b and 15c provided which are located underneath terminal contact regions 29a and 21, as well as 23 and 25 and moreover 27 and 29, respectively, and the parts of the epitaxial pocket 13 located therebetween. There are no buried layers underneath resistor regions 17 and 19. Terminal contact regions 21, 23, 25, and 27 constitute useful resistor terminal contact regions, while terminal contact regions 29 and 29a constitute auxiliary resistor terminal contact regions.

The consequence of this semiconductor structure is that not only the two diffused resistor regions 17 and 19 act as resistance paths, but also the parts of the epitaxial pocket 13 located between the regions with buried layers 15a, 15b and 15c.

While resistor regions 17 and 19 constitute useful resistors of the resistor chain, the parts of epitaxial pocket 13 without buried layer constitute the auxiliary resistor. Due to the fact that the two respectively adjacent end terminals of the useful resistor chain and of the auxiliary resistor are connected to the same potential, the entire voltage drop across the useful resistor chain on the one hand and the auxiliary resistor on the other hand is of equal amount. Due to the very low resistance of the buried layer, the voltage drop in epitaxial pocket 13, in those portions where the buried layer is provided, is of negligible extent and consequently takes place almost only in those parts of epitaxial pocket 13 in which no buried layer is present.

Figure 6:
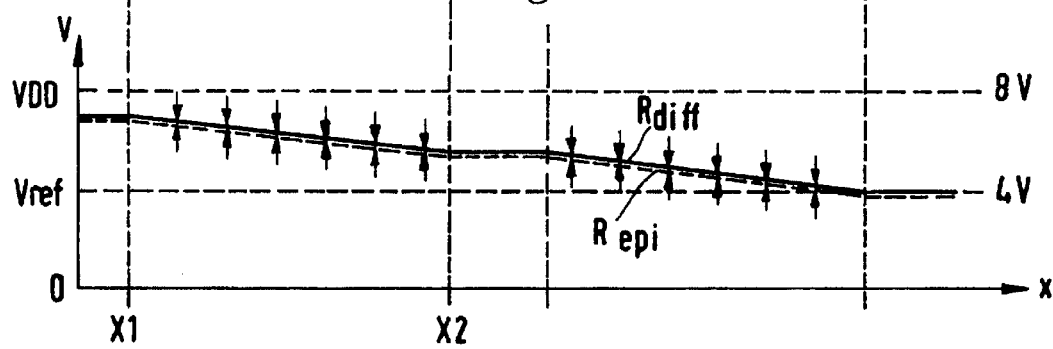
FIG. 6 shows voltage drop curves at the two useful resistors and the auxiliary resistor of 5.

According to the disclosed embodiment of the invention, it is provided in addition that the useful resistor regions 17 and 19 on the one hand and the auxiliary resistor region 13 on the other hand have identical topographies, as will be elucidated in more detail by way of FIGS. 14 to 18. This correspondence in topography has the effect that there is not only a voltage drop of equal amount across the useful resistor chain and across the auxiliary resistor chain, but that the auxiliary voltage drop curves along the two useful resistor regions 17 and 19 on the one hand and along the auxiliary resistor region 13 on the other hand have an approximately identical curve shape. This is illustrated in FIG. 6, in which the voltage drop curve Rdiff in solid line represents the voltage drop along the two diffused useful resistors and the voltage drop curve Repi in broken lines represents the voltage drop curve along the auxiliary resistor. Both voltage curves are identical in the ideal case and in practical application are located closely adjacent each other, which however can be shown only poorly in a drawing.

Figure 6A:
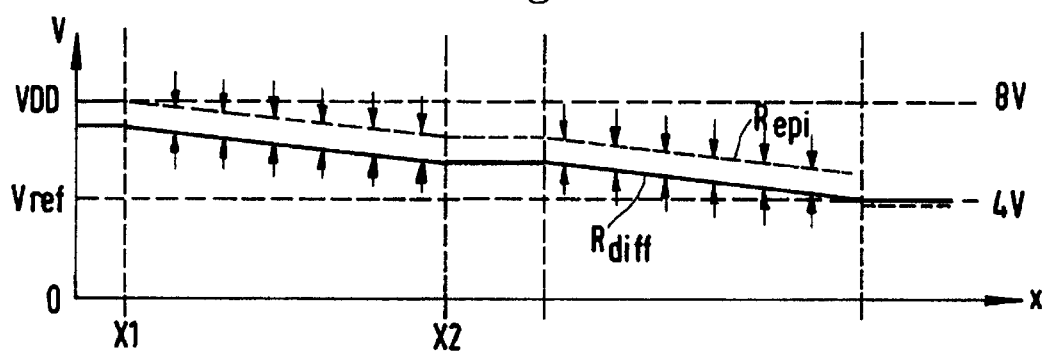

FIG. 6a shows the shifted voltage drop curve of the auxiliary resistor in case d.c. voltage sources are used between the respectively adjacent end terminal contacts of useful resistor chain and auxiliary resistor according to FIG. 1b.

Figure 7:
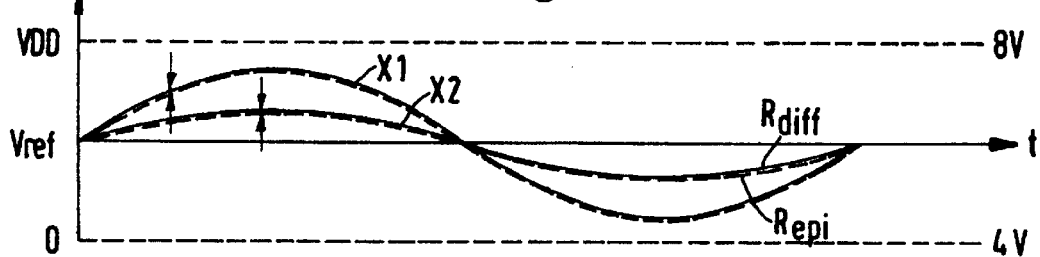
FIG. 7 shows a.c. voltage curves at different locations of the resistor chain shown in FIG. 5.

FIG. 7 shows an a.c. voltage signal similar to FIG. 4, however, just at two locations x1 and x2 along the resistor chain of FIG. 5. This figure shows that, also if an alternating voltage is applied to the resistor chain, there is always occurring the same potential difference across the individual points along the two space-charge regions 41 and 43 and that thus, apart from deviations in the voltage drop curve of the auxiliary resistor, modulation of the space-charge regions and thus of the useful resistors does not take place.

In case of exact topography correspondence between useful resistor regions and auxiliary resistor region, the two voltage drop curves Rdiff and Repi are almost identical. Just the voltage drop curve in the auxiliary resistor is modulated by the same effect, namely that of modulation of the breadth of the insulating space-charge region No. 111 in FIG. 5 between auxiliary resistor and underlying substrate. The resulting voltage dependency of the voltage drop curve of the auxiliary resistor, however, is similarly low as in case of conventional resistors and hardly is of further effect in the useful resistor. This means that on the one hand, at all locations along the pn junctions, there is occurring at all times almost the same potential difference and that, on the other hand, if an audio a.c. voltage signal is applied to the resistor chain, there still is occurring at all times and at all locations along the two pn junctions approximately the same potential difference. Thus, changes and modulation of the space-charge regions 41 and 43 are substantially lower. The integrated resistors, in case of audio applications, have substantially reduced distortion, or in case of d.c. voltage applications have substantially reduced voltage-dependency.

In practical applications of semiconductor circuits, certain deviations of the topographies of useful resistor regions and the auxiliary resistor region will arise. The consequence hereof is that the two voltage drop curves Rdiff and Repi will no longer coincide so well, but will have certain deviations from each other. This and the potential difference due to modulation in the auxiliary resistor have the effect that also a resistor chain according to this embodiment of the invention still causes a certain distortion factor, which however is considerably lower than in prior resistor chains. Due to the fact that the audio signal tapped at audio signal output Audio out usually is supplied to the input of an operational amplifier which in turn causes a distortion factor of a certain degree, which in practical applications is in the range of 0.0005% at 1 Vrns, it is not necessary to bring the distortion factor caused by the resistor chain clearly below this value. Certain topography differences between useful resistor regions and auxiliary resistor region may thus be tolerated.

Figure 8:
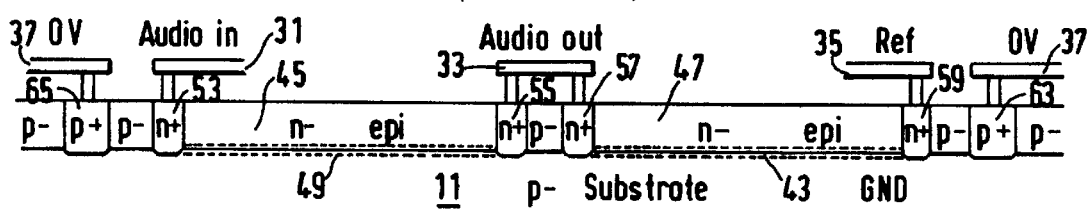
FIG. 8 shows a resistor chain with two epitaxial resistors of conventional type.
Figure 9:
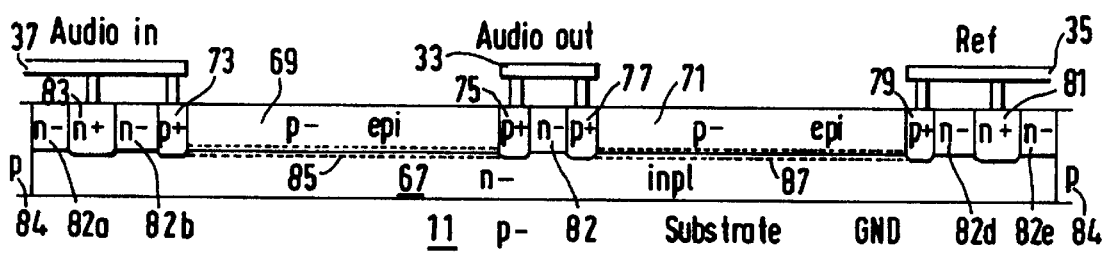
FIG. 9 shows a resistor chain with two epitaxial useful resistors and an auxiliary resistor located therebeneath, which is formed from a buried layer.

FIGS. 8 and 9 each show a sectional view of a resistor chain having two epitaxial resistors of conventional type and inventive type, respectively.

The resistor chain according to FIG. 8 comprises two epitaxial resistors formed by two epitaxial resistor regions 45 and 47 of $n^-$ conductivity, which are provided on the surface of a substrate 11 of $p^-$ conductivity. The epitaxial resistor regions 45 and 47 are provided with terminal contact regions 53, 55, 57 and 59 of $n^+$ conductivity each. These terminal contact regions are connected to the metallic conductive tracks 31, 33 and 35, respectively, that were already elucidated hereinbefore in conjunction with FIG. 2. Substrate 11 has at least one terminal contacting region 63 of $p^+$ conductivity fed with ground potential, for example 0 Volt, via metallic conductive track 37. There may also be provided at least one additional terminal contacting region 65 for substrate 11, which then would be connected to metallic conductive track 37 as well. Between the epitaxial resistor regions 45, 47 and the substrate 11, there are pn junctions in whose area space-charge regions 49 and 51 are formed.

For the same reasons as elucidated hereinbefore in conjunction with FIGS. 2 to 4, such epitaxial resistors also involve dependency of the potential difference acting on the space-charge regions 49 and 51, and thus dependency of the epitaxial resistors, on the respective voltage applied, as well as modulation of the resistors upon application of an alternating voltage to the resistors. The sole difference is that, when looking at FIGS. 3 and 4 in connection with the resistors of FIG. 8, the vertical arrows are not to be oriented on the basis of VDD, but GND (0 Volt) since in the case of FIG. 8, 0 V and not VDD is applied to metallic conductive track 37.

In the resistor chain according to the invention, as shown in FIG. 9, epitaxial resistor regions 69 and 71 of p conductivity are provided with useful resistor regions, that are not formed on substrate 11 directly, but on a region 67 of $n^-$ conductivity that is formed in the substrate surface and serves as auxiliary resistor region. This auxiliary resistor region may be formed by epitaxy, diffusion or ion implantation. The useful resistor regions 69 and 71 and the $p^+$ terminal contact regions 73, 75, 77, and 79 thereof are isolated by $n^-$ areas 82a to 82e. Auxiliary resistor region 67 may be isolated by p areas 84' extending down into the $p^-$ substrate.

The epitaxial useful resistor regions 69 and 71 in FIG. 9 are provided each with two terminal contact regions 73 and 75 as well as 77 and 79, respectively, which are of $p^+$ conductivity in FIG. 9. Auxiliary resistor region 67 is provided with two terminal contact regions 81 and 83 of $n^+$ conductivity. Terminal contact regions 73 and 83 are commonly connected to audio signal input Audio in via metallic conductive track 37. The two terminal contact regions 75 and 77 are connected to audio signal output Audio out via metallic conductive track 33. The remaining two terminal contact regions 79 and 81 are commonly connected to reference voltage source Ref via metallic conductive track 35.

Terminal contact regions 73, 75, 77, and 79 constitute useful resistor terminal contact regions, whereas terminal contact regions 81 and 83 constitute auxiliary resistor terminal contact regions.

At the pn junctions between the epitaxial useful resistor regions 69 and 71 and the epitaxial, diffused or implanted auxiliary resistor region 67, there are formed space-charge regions 85 and 87, respectively, at which, for the reasons elucidated hereinbefore in conjunction with FIGS. 5 to 7, potential differences occur that remain the same or substantially the same, both in terms of space along the useful resistor regions 69 and 71 and in terms of time when an a.c. voltage is applied to the resistors. In this case too, a corresponding reduction of the distortion factor occurs during audio signal operation.

Resistor chains with two polycrystalline resistors of conventional type and inventive type shall be considered now by way of FIGS. 10 through 13.

Figure 10:
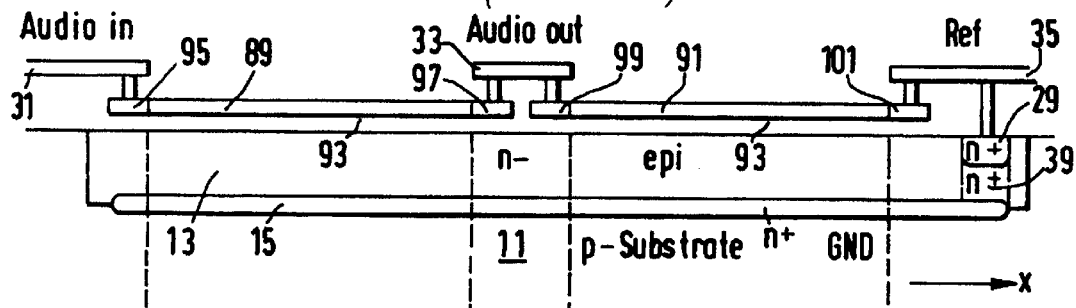
FIG. 10 shows a resistor chain with two polycrystalline resistors of conventional type.

The resistor chain illustrated in FIG. 10, comprising two resistors of polycrystalline silicon, in conformity with the semiconductor structure shown in FIG. 2 comprises an epitaxial pocket 13 of n⁻ conductivity formed on a substrate 11 of p⁻ conductivity and having a buried layer 17 of n⁺ conductivity. Differently from the semiconductor structure shown in FIG. 2, the resistor chain shown in FIG. 10 has the two resistors formed by two polycrystalline resistor regions 89 and 91, i.e., by one polycrystalline silicon layer each. Between the polycrystalline resistor regions 89, 91 and the epitaxial pocket 13 there is provided an electrically insulating layer, usually an oxide layer 93.

The two polycrystalline resistor regions 89 and 91, at the ends thereof, are provided with terminal contact regions 95, 97, 99, and 101, respectively, forming useful resistor terminal contact regions, by means of which they are connected to metallic conductive tracks 31, 33 and 35 and thus to audio signal input Audio in, audio signal output Audio out and reference voltage source Ref, respectively. Buried layer 15 of epitaxial pocket 13 is connected, via a terminal contact region 29 and a sinker 39, to metallic conductive track 35 as well and thus has also applied thereto the reference voltage Vref of reference voltage source Ref.

Via oxide layer 93, the polycrystalline resistor regions 89, 91 are subject to the influence of the respective potential difference between polycrystalline resistor region 89, 91 and epitaxial pocket 13. This leads to a charge carrier concentration within the bottom side of polycrystalline resistor regions 89 and 91 adjacent oxide 93, which changes in response to said potential difference. Also, with polycrystalline resistors, this has an effect on the resistance value and causes distortion when these resistors have a.c. voltages applied thereto.

Figure 11:
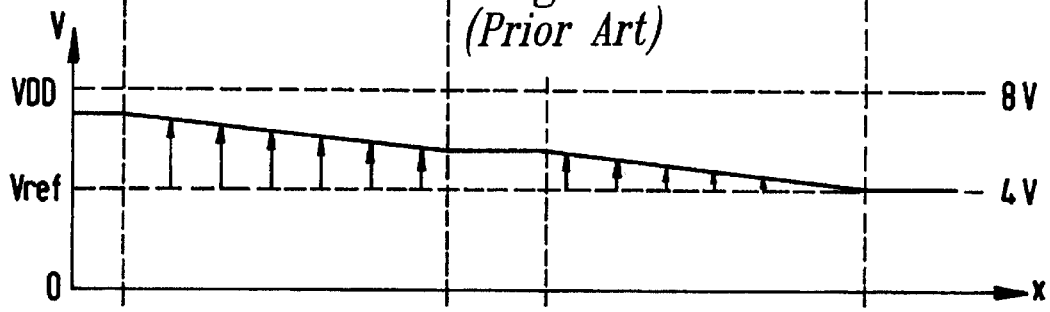
FIG. 11 shows a voltage drop curve along the two polycrystalline resistors of FIG. 10.

FIG. 11 illustrates the voltage drop curve along the polycrystalline resistors of FIG. 10. The field-strength dependent effect on the area of the respective polycrystalline resistor region 89 and 91, respectively, adjacent to the oxide layer 93, is dependent upon the respective differential voltage, as indicated in FIG. 11 by vertical arrows. As regards the field-strength dependent effect on the polycrystalline resistors by way of an a.c. voltage, the same considerations apply as pointed out in conjunction with FIG. 4.

The field-strength dependent effect on the polycrystalline resistors is in fact lower than the effect on the diffused resistors and the epitaxial resistors via the space-charge regions thereof, so that lower distortion factors can be obtained by polycrystalline resistors of conventional type than with diffused and epitaxial resistors of conventional type. However, by application of the measures according to the invention, a still further reduction of the distortion factor can be obtained.

Figure 12:
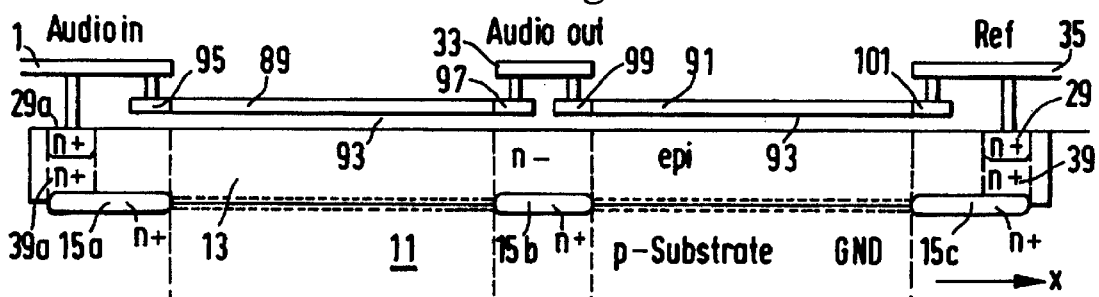
FIG. 12 shows a resistor chain according to the invention, comprising two polycrystalline useful resistors and an epitaxial auxiliary resistor.
Figure 13:
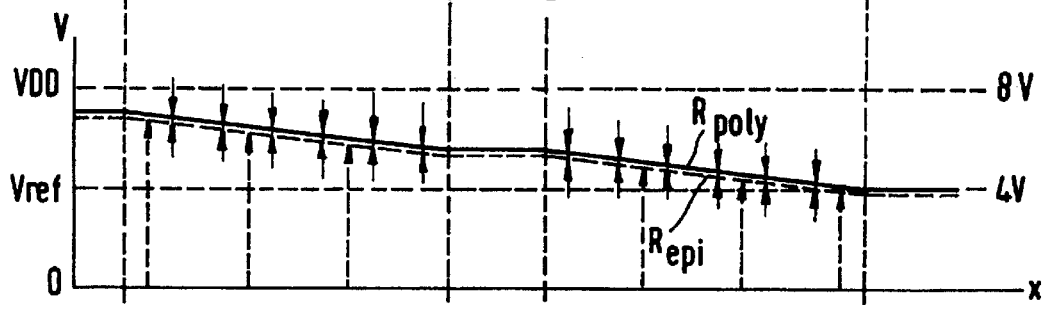
FIG. 13 shows a voltage drop curve as it occurs along the resistor chain of FIG. 12.

The semiconductor structure of a resistor chain according to another embodiment of the invention, comprising two polycrystalline resistors, as shown in FIG. 12, corresponds to the semiconductor structure shown in FIG. 10 with the exceptions that—as in the case of FIG. 5—epitaxial pocket 13 is formed as auxiliary resistor region which has buried layers 15a, 15b and 15c only outside of polycrystalline resistor regions 89 and 91. Moreover, epitaxial auxiliary resistor region 13 is connected to a terminal contact region 29a on its left-hand side in FIG. 12 as well, said terminal contact region 29a being connected to metallic conductive track 31 and thus to audio signal input Audio in. Terminal contact region 29a is connected to buried layer 15a via a sinker 39a.

As in case of the embodiments of the invention shown in FIGS. 5 and 9, it holds for FIG. 12 as well that the polycrystalline resistor regions 89 and 91 in total and the epitaxial auxiliary resistor region 13 located therebelow have identical topographies. For this reason and since epitaxial auxiliary resistor region 14 is connected in parallel to series-connected polycrystalline useful resistor regions 89 and 91, voltage drop curves of equal shape arise along the useful resistor regions and along the auxiliary resistor region, and the voltage drop curve shown in FIG. 13 thus holds both for the polycrystalline useful resistors and approximately also for the epitaxial auxiliary resistor. In case of ideal topography conformity of useful resistors and auxiliary resistor, there is thus no effect on the resistor in accordance with the location along the resistor regions, nor hardly any resistance modulation in case an a.c. voltage signal is applied to the resistors. Only the modulation of the space-charge region 111 in FIG. 12 between auxiliary resistor and substrate produces a slight deviation in the voltage drop curve of the auxiliary resistor from the voltage drop curve of the useful resistor chain. The voltage modulating the auxiliary resistor is indicated in broken-line arrows in FIG. 13.

Instead of polycrystalline silicon, silicon-chromium or similar materials may also be used for useful resistor regions 89 and 91.

Topography examples of resistor chains according to the invention with polycrystalline resistors shall now be elucidated by way of FIGS. 14 to 18. FIGS. 14 and 15 show topography examples of the resistor chains illustrated in FIGS. 10 and 12. Differently from FIG. 14, FIG. 15 does not reveal a buried layer 15 in the area of the polycrystalline useful resistor regions 89 and 91. Short pieces 15a, 15b and 15c of a buried layer are provided only in the area of the terminal contact regions. Metallic conductive tracks 31 and 35 are modified in comparison with FIG. 14 such that they connect the adjacent terminal contact regions 29 and 101 as well as 29a and 95, respectively, to each other.

Figure 16:
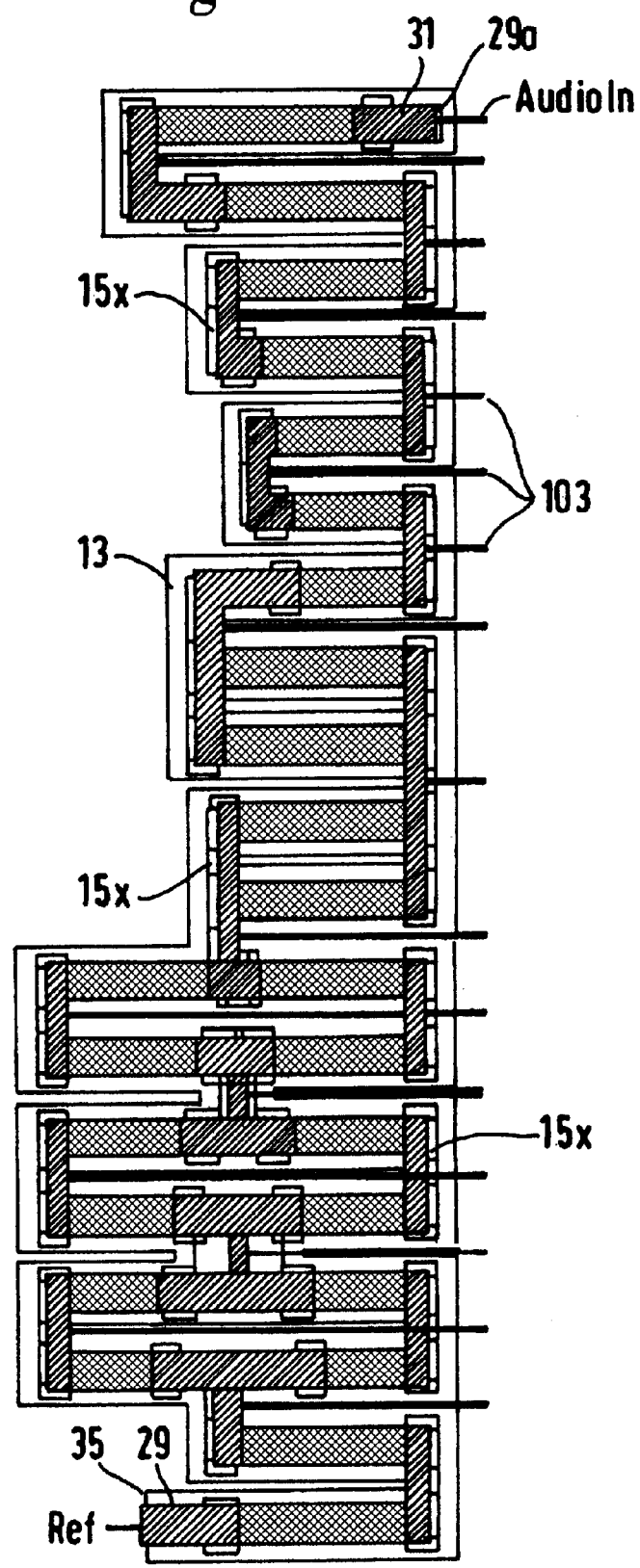
FIG. 16 shows an example of a topography of a resistor chain having a larger number of polycrystalline resistors according to the invention.

A topography example of a complexer resistor chain designed according to the invention is shown in FIG. 16. Metallic conductive tracks are shown as fully black areas thereon. To the upper right in FIG. 16, there is located the metallic conductive track 31 for connection to audio signal input Audio in. Approximately to the lower left in FIG. 16, there is located the metallic conductive track 35 for connected to reference voltage source Ref. The metallic conductive tracks 103 are each connected via switches, not shown, to audio signal output "Audio out" and correspond to partial voltage taps A1, A2, . . . A5 in FIG. 1.

Figure 17:
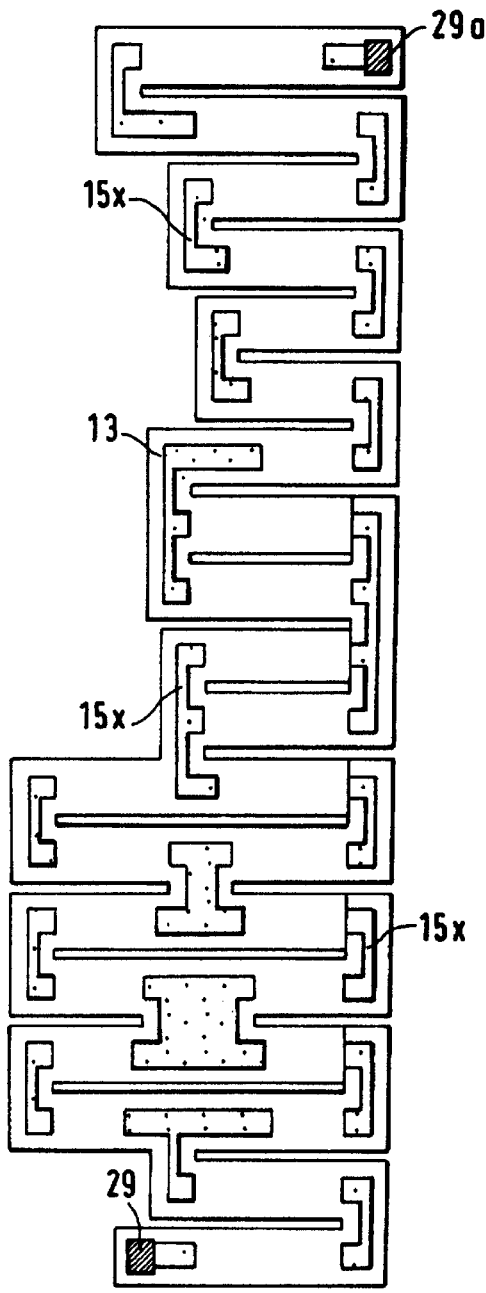
FIG. 17 shows the topography of an epitaxial auxiliary resistor, as it may be used in a resistor chain according to the invention, as shown in FIG. 16.
Figure 18:
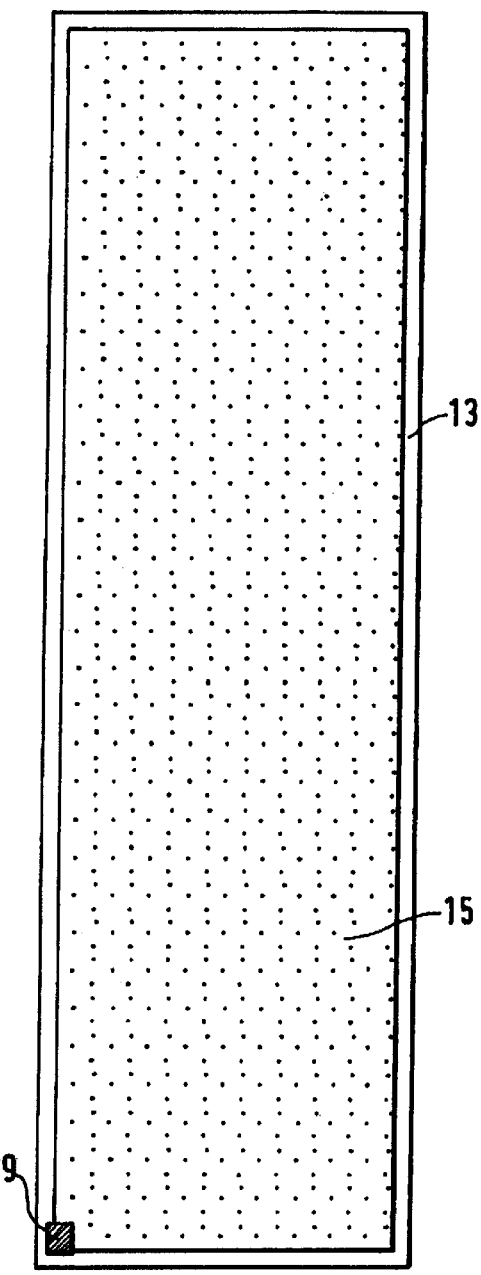
FIG. 18 shows an example of a topography of an epitaxial pocket as it would be used for a conventional polycrystalline resistor chain having the topography shown in FIG. 16.

FIG. 17 illustrates the topography of the epitaxial pocket 13 constituting the epitaxial auxiliary resistor, with the individual short pieces of buried layers 15x being shown separately. In comparison therewith, FIG. 18 shows the topography of an epitaxial pocket 13 having a buried layer 15 of large area, as it would be used in the design of a resistor chain with the topography shown in FIG. 16.

By way of a resistor chain according to the invention, with polycrystalline useful resistors and an epitaxial auxiliary resistor, the typical distortion factor of 0.004% caused by the useful resistor chain can be reduced to clearly below 0.001% (at 1 Vrms and −6 db attenuation) and thus to the range of the distortion factor of operational amplifiers realized in practical application. The distortion factor still caused by a resistor chain according to the invention is dependent in essence on the accuracy of the topography conformity between useful resistors and auxiliary resistor.

Figure 19:
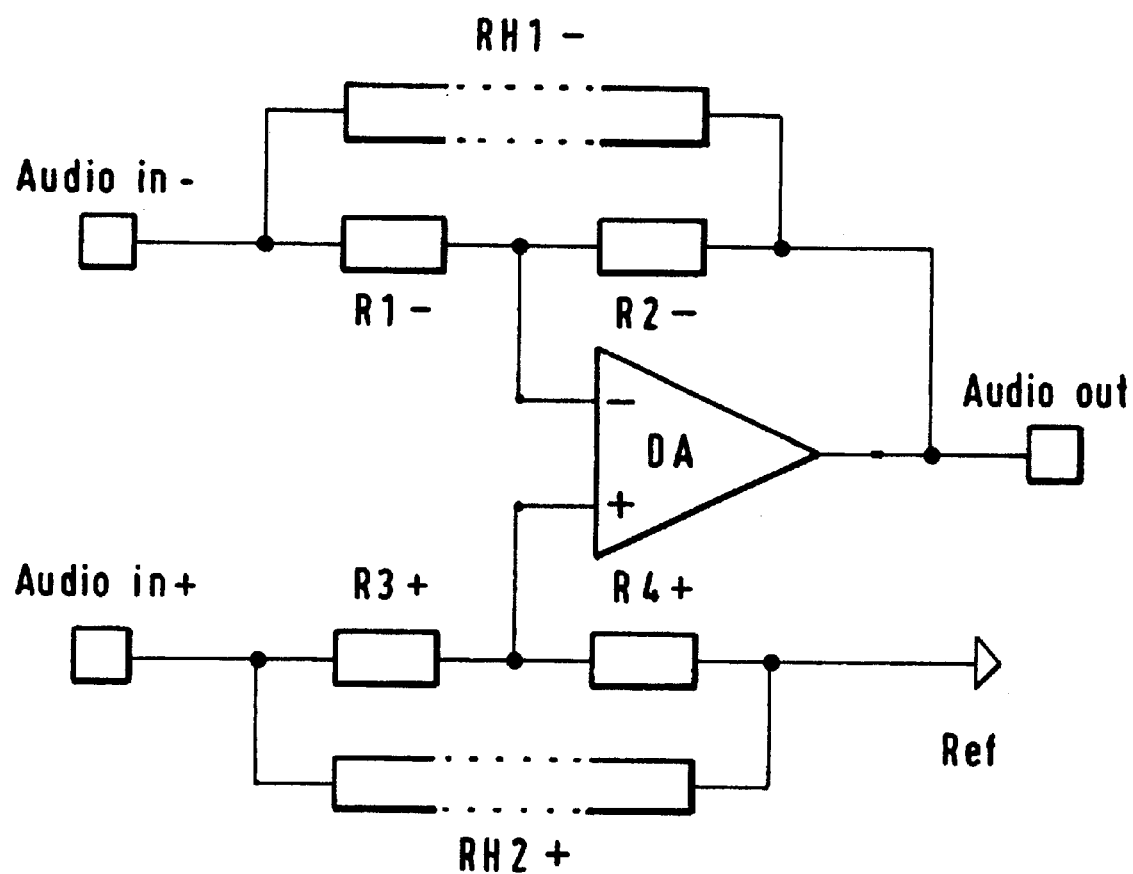
FIG. 19 shows a circuit diagram of an example of the application of the invention in a differential stage.

The principle of the invention, to arrange two resistors having substantially identical topographies in semiconductor materials arranged on top of each other, may be used for differential stages as well. An example in this respect is shown in FIG. 19, comprising a differential amplifier DA having an inverting terminal−, a non-inverting terminal+ and an output constituting an audio signal output Audio out. A first useful resistor chain having two useful resistors R1− and R2− is connected between a first audio signal input Audio in− and Audio out, whereas a second useful resistor chain R3+ and R4+ is connected between a second audio signal input Audio in+ and Audio out. A connecting node between R1− and R2− is connected to the inverting input−, and a connecting point between R3+ and R4+ is connected to the non-inverting input+. The two resistor chains R1−, R2− and R3+, R4+ each have associated therewith an auxiliary resistor RH1 and RH2+, respectively, according to the invention.

While representative embodiments of the invention have been illustrated and described, it is to be understood that various changes may be made therein without departing from the spirit and scope of the invention. Thus, the invention is to be limited only by the scope of the claims that follow and the equivalents thereof.

What is claimed is:

1. An electrical resistor integrated in an integrated semiconductor circuit, comprising:

a useful resistor having two spaced-apart useful resistor terminal contact regions and a useful resistor region of semiconductor material located therebetween;

an auxiliary resistor having two spaced apart auxiliary resistor terminal contact regions and an auxiliary resistor region located therebetween, said auxiliary resistor region formed in semiconductor material located underneath said useful resistor region; and said useful resistor region (17, 19; 69, 71; 89, 91) and said auxiliary resistor region (13; 67) have a substantially identical topography;

and said auxiliary resistor terminal contact regions and said useful resistor terminal contact regions are wired in such a manner that, on connection of the semiconductor circuit to a supply voltage source, the auxiliary resistor terminal contact region at one end of said auxiliary resistor region and the auxiliary resistor terminal contact region at the other end of said auxiliary contact region each have the same potential difference with respect to the respectively adjacent useful resistor terminal contact region.

2. The resistor of claim 1, wherein said potential difference is zero.

3. The resistor of claim 2, wherein said auxiliary resistor terminal contact regions are connected to the respectively adjacent useful resistor terminal contact regions.

4. The resistor of claim 1, wherein a d.c. voltage source with the same voltage value is connected between each of said auxiliary resistor terminal contact regions and the respectively adjacent useful resistor terminal contact region.

5. The resistor of claim 1, wherein each of said auxiliary resistor terminal contact region s have a voltage follower connected in series therewith.

6. The resistor of claim 1, wherein said auxiliary resistor region is formed by an epitaxial layer of a first conductivity type formed on a semiconductor substrate.

7. The resistor of claim 6, wherein said useful resistor terminal contact regions are of high conductivity, and in areas of the epitaxial layer located underneath said useful resistor region there is formed one buried layer of high conductivity each, the topography thereof being approximately identical with the topography of the respectively associated useful resistor terminal contact region.

8. The resistor of claim 7, wherein buried layers located in the area of said auxiliary resistor terminal contact regions extend down below the respective auxiliary resistor terminal contact region.

9. The resistor of claim 8, wherein each of said auxiliary resistor terminal contact regions is connected to the respectively associated buried layer via a sinker.

10. The resistor of claim 6, wherein said useful resistor region is constituted by a layer selected from a material group containing polycrystalline silicon and silicon-chromium, and is located above said epitaxial layer and separated from the same by an intermediate region in the form of an oxide layer.

11. The resistor of claim 6, wherein said useful resistor region is constituted by a diffusion region diffused into the surface of said epitaxial layer, said diffusion region being of a conductivity type opposite to the conductivity type of said epitaxial layer and being separated from said epitaxial layer by an intermediate region in the form of a pn space-charge region.

12. The resistor of claim 6, wherein said useful resistor region is constituted by a second epitaxial layer formed on said first epitaxial layer, said second epitaxial layer being of a second conductivity type opposite to the first conductivity type and being separated from said first epitaxial layer by an intermediate region in the form of a pn space-charge region.

13. The resistor of claim 1, wherein said auxiliary resistor region is formed in a doping region of a first conductivity type that is located in a substrate of an opposite, second conductivity type, and wherein said useful resistor region is constituted by an epitaxial layer of said second conductivity type that is formed on said doping region.

14. A resistor chain formed in an integrated semiconductor circuit, comprising: a predetermined number of series-connected resistors and end terminal contacts at both ends of said resistor chain, and tapping contacts between the individual resistors, each resistor comprising a useful resistor having two spaced apart useful resistor terminal contact regions and a useful resistor region of semiconductor material located therebetween;

an auxiliary resistor having two spaced apart auxiliary resistor terminal contact regions and an auxiliary resistor region located therebetween, said auxiliary resistor region formed in semiconductor material located underneath said useful resistor regions;

intermediate regions provided between said useful resistor regions and said auxiliary resistor region;

said useful resistor regions in total on the one hand and said auxiliary resistor region on the other hand have a substantially identical topography; and said useful resistor terminal contact regions forming said end terminal contacts, and said auxiliary resistor terminal contact regions wired in such a manner that, on connection of the semiconductor circuit to a supply voltage source, the auxiliary resistor terminal contact region at one end of said auxiliary resistor region and the auxiliary resistor terminal contact region at the other end of said auxiliary contact region each have the same potential difference with respect to the respectively adjacent useful resistor terminal contact region.

15. The resistor chain of claim 14, wherein said potential difference is zero.

16. The resistor chain of claim 15, wherein said auxiliary resistor terminal contact regions are connected to the respectively adjacent useful resistor terminal contact regions.

17. The resistor chain of claim 14, wherein a d.c. voltage source with the same voltage value is connected between each of said auxiliary resistor terminal contact regions and the respectively adjacent useful resistor terminal contact region.

18. The resistor chain of claim 14, wherein each of said auxiliary resistor terminal contact regions has a voltage follower connected in series therewith.

19. The resistor chain of claim 14, wherein said auxiliary resistor region is formed by an epitaxial layer of a first conductivity type formed on a semiconductor substrate.

20. The resistor chain of claim 19, wherein useful resistor terminal contact regions are formed in said useful resistor regions in the area of said useful resistor terminal contacts, and in areas of the epitaxial layer used as auxiliary resistor and located underneath said useful resistor terminal contact regions there is formed one buried layer of high conductivity each, the topography thereof being approximately identical with the topography of the respectively associated useful resistor terminal contact region.

21. The resistor chain of claim 19,
wherein said useful resistor regions are each constituted by a layer of polycrystalline silicon selected from a material group containing polycrystalline silicon and silicon-chromium, and are located above said epitaxial layer and separated from the same by an intermediate region in the form of an oxide layer.

22. The resistor chain of claim 19,
wherein said useful resistor regions are constituted by regions diffused or implanted into the surface of said epitaxial layer, said regions being of a conductivity type opposite to the conductivity type of said epitaxial layer and being separated from said epitaxial layer by intermediate regions in the form of pn space-charge regions.

23. The resistor chain of claim 19,
wherein useful resistance region gaps are present in the area of the tapping contacts between adjacent useful resistor regions, and said auxiliary resistance region has one buried layer each of high conductivity at the locations of the individual useful resistor region gaps, said buried layers and the respectively associated useful resistor region gaps having a substantially identical topography.

24. The resistor chain of claim 23, wherein buried layers located in the area of said auxiliary resistor terminal contact regions extend down below the respective auxiliary resistor terminal contact region.

25. The resistor chain of claim 24, wherein each of said auxiliary resistor terminal contact regions is connected to the respectively associated buried layer via a sinker.

26. The resistor chain of claim 14,
wherein said useful resistor region is formed in a doping region of a first conductivity type that is located in a substrate of an opposite, second conductivity type, and wherein said useful resistor regions are constituted by an epitaxial layer of said second conductivity type that is formed on said doping region.

27. A circuit, comprising: an analog signal attenuation circuit and a resistor chain formed in an integrated semiconductor circuit, the resistor chain comprising a predetermined number of series-connected resistors and end terminal contacts at both ends of said resistor chain, and tapping contacts between the individual resistors, each resistor comprising a useful resistor having two spaced apart useful resistor terminal contact regions and a useful resistor region of semiconductor material located therebetween;

an auxiliary resistor having two spaced apart auxiliary resistor terminal contact regions and an auxiliary resistor region located therebetween, said auxiliary resistor region formed in semiconductor material located underneath said useful resistor regions;

intermediate regions provided between said useful resistor regions and said auxiliary resistor region;

said useful resistor regions in total on the one hand and said auxiliary resistor region on the other hand have a substantially identical topography; and said useful resistor terminal contact regions forming said end terminal contacts, and said auxiliary resistor terminal contact regions wired in such a manner that, on connection of the semiconductor circuit to a supply voltage source, the auxiliary resistor terminal contact region at one end of said auxiliary resistor region and the auxiliary resistor terminal contact region at the other end of said auxiliary contact region each have the same potential difference with respect to the respectively adjacent useful resistor terminal contact region.

28. The circuit of claim 27, wherein an audio signal input terminal is connected to one of the two end terminal contacts, a reference potential terminal is connected to the other end terminal contact, and an audio signal output is adapted to be selectively connected to one of the tapping contacts.

29. The circuit of claim 28, wherein said audio signal output is connected, via a controllable switch each, to each of said tapping contacts and at least to that one of the end terminal contacts that is connected to said audio signal input terminal.

30. An integrated resistor circuit, comprising:
a first resistor formed with a substrate of semiconductor material by an epitaxial layer of a first conductivity type, and first and second terminal contact regions formed on first and second ends of the first resistor, respectively;

a second resistor formed below the first resistor in the substrate of semiconductor material, and first and second terminal contact regions formed on first and second ends of the second resistor, respectively, the first and second resistors formed to have substantially the same topography and potential difference between their respective first and second terminal contact regions when coupled to a voltage source.

31. The circuit of claim 30, wherein the first resistor is formed from a layer selected from a material group containing polycrystalline silicon and silicon-chromium, and is formed above and separated from the second resistor by an intermediate region formed of an oxide layer.

32. The circuit of claim 30, wherein the first resistor is formed by a diffusion region diffused into the surface of the epitaxial layer, the diffusion region formed of a conductivity type opposite to the conductivity type of the epitaxial layer and separated from the epitaxial layer by an intermediate region of a pn space-charge region.

33. The circuit of claim 30, wherein the first resistor is formed by a second epitaxial layer formed on the first epitaxial layer, the second epitaxial formed of a second conductivity type opposite to the first conductivity type and separated from the epitaxial layer of first conductivity type by an intermediate region in the form of a pn space-charge region.

34. The circuit of claim 30, wherein the second resistor is formed in a doping region of a first conductivity type that is formed in the substrate of a second conductivity type that is opposite to the first conductivity type, and wherein the first resistor is formed by an epitaxial layer of the second conductivity type that is formed on the doping region.

* * * * *